United States Patent
Goodnow et al.

(10) Patent No.: US 7,134,104 B2
(45) Date of Patent: Nov. 7, 2006

(54) METHOD OF SELECTIVELY BUILDING REDUNDANT LOGIC STRUCTURES TO IMPROVE FAULT TOLERANCE

(75) Inventors: Kenneth J. Goodnow, Essex Junction, VT (US); Clarence R. Ogilvie, Huntington, VT (US); Jack R. Smith, South Burlington, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 228 days.

(21) Appl. No.: 10/707,323

(22) Filed: Dec. 5, 2003

(65) Prior Publication Data

US 2005/0125749 A1    Jun. 9, 2005

(51) Int. Cl.
*G06F 17/50* (2006.01)
(52) U.S. Cl. .............. 716/3; 716/4; 716/5; 716/18
(58) Field of Classification Search .......... 716/1–7, 716/18; 714/1–311, 724–745, 732–738
See application file for complete search history.

(56) References Cited

U.S. PATENT DOCUMENTS

| | | | |
|---|---|---|---|
| 4,517,639 A * | 5/1985 | Ferrell et al. ............. | 700/81 |
| 4,583,224 A * | 4/1986 | Ishii et al. ............... | 714/10 |
| 4,964,126 A * | 10/1990 | Musicus et al. .......... | 714/797 |
| 5,144,230 A * | 9/1992 | Katoozi et al. ........... | 324/537 |
| 5,159,598 A * | 10/1992 | Welles et al. ............ | 714/724 |
| 5,883,809 A * | 3/1999 | Sullivan et al. .......... | 716/3 |
| 5,903,717 A * | 5/1999 | Wardrop .................. | 714/12 |
| 5,907,671 A * | 5/1999 | Chen et al. .............. | 714/6 |
| 5,923,830 A * | 7/1999 | Fuchs et al. ............. | 714/11 |
| 5,931,959 A * | 8/1999 | Kwiat ...................... | 714/48 |
| 6,311,317 B1 * | 10/2001 | Khoche et al. ........... | 716/18 |
| 6,526,559 B1 * | 2/2003 | Schiefele et al. ......... | 716/16 |
| 6,857,110 B1 * | 2/2005 | Rupp et al. .............. | 716/4 |
| 6,904,576 B1 * | 6/2005 | Ng et al. ................. | 716/4 |
| 2004/0015735 A1 * | 1/2004 | Norman ................... | 714/10 |

* cited by examiner

*Primary Examiner*—Paul Dinh
*Assistant Examiner*—Nghia M. Doan
(74) *Attorney, Agent, or Firm*—Downs Rachlin Martin PLLC

(57) ABSTRACT

A new hardware description language (HDL) extension at the register-transfer level (RTL) for designating particular logic functions as fault tolerant and a method of implementing a fault redundant scheme for the fault tolerant logic functions. Code (20) is written in VHDL at the RTL and includes instructions for adding the operator "FT" to certain logic functions. Logic functions that include the FT operator are considered critical functions, i.e., fault tolerant. By including the FT operator, a logic synthesis tool is alerted to the functions that have been designated as fault tolerant. As a result, the preprogrammed logic synthesis tool causes the design of the IC to include a fault redundant scheme (30) for the logic functions that include the FT operator. Fault redundant scheme (30) includes three copies of the logic function, i.e., Copy A (32), Copy B (34), and Copy C (36), as well as a majority voter 38.

9 Claims, 2 Drawing Sheets

```
Library ieee;
use ieee.std_logic_1164.all;

ENTITY mydesign IS
    PORT (in1, in2:    in std_logic_vector(3 downto 0);
          out1, out2:  outstd_logic_vector(3 downto 0);
    end;

ARCHITECTURE udcounter_arch of udcounter IS
signal sig1, sig2: std_logic_vector(3 downto 0);
begin
    . . . .
sig1 <= in1 or in2
sig2 <= in2 and in2;
out1 <= FT(sig1); --Out1 is a critical function. Implement 3 copies and voter in
FPGA.
out2 <= sig2; ==Out2 is not fault tolerant.  Create only one copy.
end
```

FIG. 1

METHOD OF SELECTIVELY BUILDING REDUNDANT LOGIC STRUCTURES TO IMPROVE FAULT TOLERANCE

BACKGROUND OF INVENTION

1. Field of the Invention

The present invention relates generally to selective fault protection for logic functions in an IC design, and more particularly to a new HDL extension at the RTL for designating particular logic functions as fault tolerant and a method of implementing a fault redundant scheme for those logic functions designated as fault tolerant.

2. Background of the Invention

For the design of integrated circuits (IC) technology on a very large scale, designers typically employ computer aided design (CAD) tools. Hardware description languages (HDLs) or other standard languages are typically used to describe ICs and facilitate the design and simulation of complex digital ICs. Common HDLs include the open languages, VHDL and Verilog. VHDL and Verilog are all-purpose HDLs that utilize abstract data types to define a hardware model at the gate level, the register-transfer level (RTL), or the behavioral level.

At the RTL, a description of the IC written in HDL is typically referred to as the RTL description or the RTL code. At the RTL, a description of the system specifying all registers (whether instantiated or inferred), and combinational logic in between them (using logical statements, etc.) is outlined. The RTL description or code specifies the clock-by-clock behavior of the system. The RTL description or code of an IC describes the circuit in terms of a plurality of digital registers, clocking circuits, and logic elements that are combined to implement the desired function of the circuit.

After creation of the RTL code, a designer uses a logic synthesis tool to map the IC design to a target technology, e.g., a field-programmable gate array (FPGA) or application specific integrated circuit (ASIC). Thereafter, each logic function, e.g., combinational logic block (CLB) for FPGAs, is assigned to a location on the chip and signals are routed with wires on the chip to appropriate other logic functions.

In many prior art ICs, even a single logic fault can cause improper operation resulting in data integrity errors or a system crash. Such a scenario can occur with either a soft error, i.e., temporary fault due to radiation, or a permanent fault. Prior art IC design methodology treats each of the logic functions in an IC design the same and fails to provide a way for providing fault protection to particular logic functions. In addition, providing additional fault protection to all of the logic functions in the IC typically increases the amount of area required by the IC and thus the overall size of the IC.

SUMMARY OF INVENTION

One aspect of the present invention is a method of building fault tolerant logic functions in an integrated circuit. The method includes the following steps: creating an integrated circuit design description using a hardware design language at the register-transfer level; adding a fault tolerant operator to the particular logic functions in the integrated circuit design description; and building redundant copies for the particular logic functions having a fault tolerant operator.

Another aspect of the present invention is a method of creating fault tolerant logic functions during design of an integrated circuit using a HDL at the RTL and a logic synthesis tool. The method includes the following steps: creating an integrated circuit design description using the hardware design language at the RTL; adding a fault tolerant operator to each logic function in the integrated circuit design description; processing the integrated circuit design description through the logic synthesis tool after the adding step; and including a fault redundant scheme in the integrated circuit design description for each logic function having a fault tolerant operator.

Still another aspect of the present invention is a system for creating fault tolerant logic functions during design of an integrated circuit using a HDL at the RTL and a logic synthesis tool. The system includes the following: means for creating an integrated circuit design description using the hardware design language at the RTL; means for adding a fault tolerant operator to each logic function in the integrated circuit design description; means for synthesizing the integrated circuit design description after the means for adding step; and means for building fault redundancy into the integrated circuit design description for each logic function having a fault tolerant operator.

Other features, utilities and advantages of various embodiments of the invention will be apparent from the following more particular description of embodiments of the invention as illustrated in the accompanying drawings.

BRIEF DESCRIPTION OF DRAWINGS

For the purpose of illustrating the invention, the drawings show a form of the invention that is presently preferred. However, it should be understood that the present invention is not limited to the precise arrangements and instrumentalities shown in the drawings, wherein:

FIG. 1 is a portion of a sample VHDL code at the RTL for designating particular logic functions as fault tolerant according to one embodiment of the present invention.

DETAILED DESCRIPTION

Figure 2:
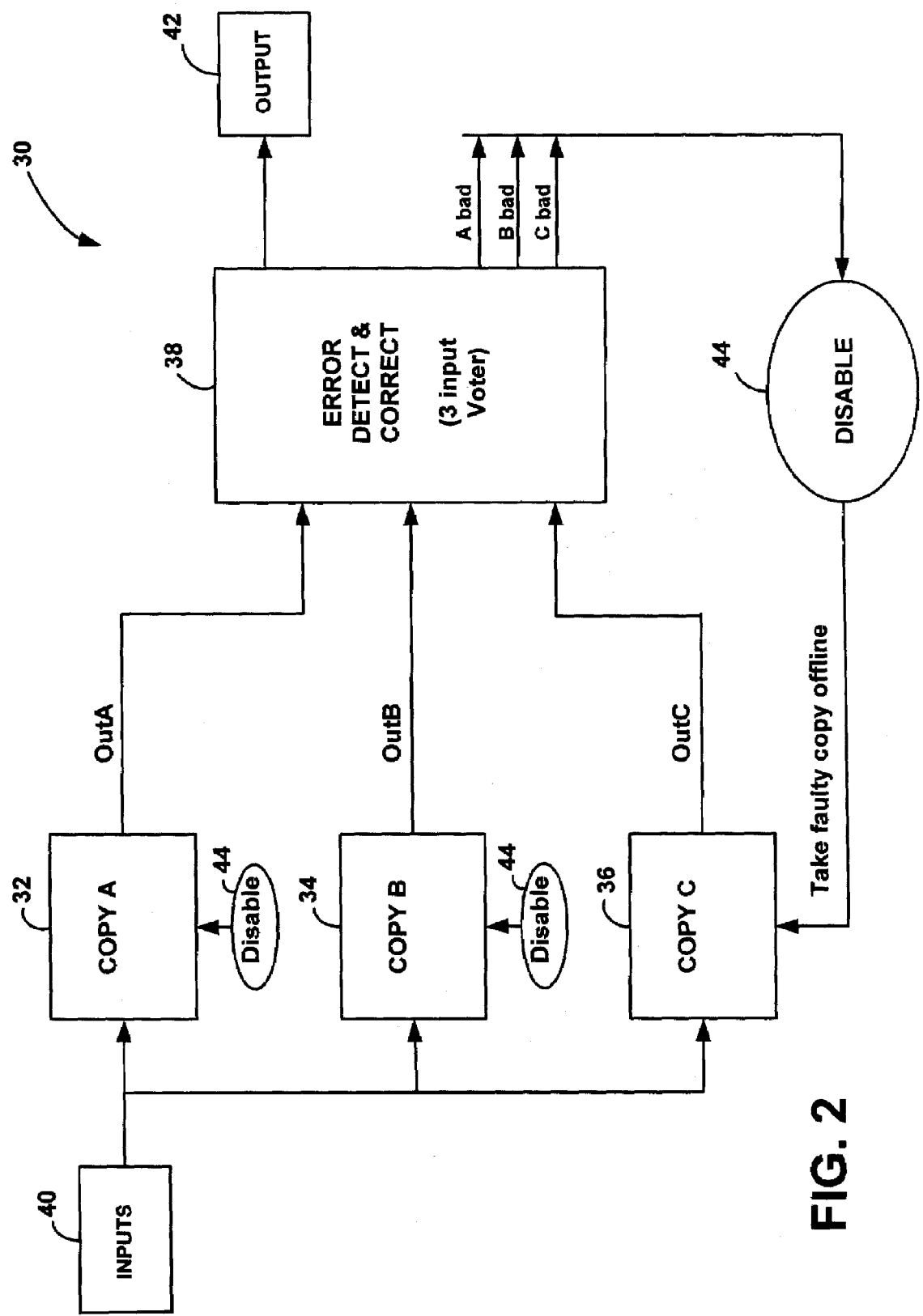
FIG. 2 is a block diagram of a fault redundant scheme according to one embodiment of the present invention.

The present invention is directed to a new HDL extension at the RTL for designating particular logic functions as fault tolerant and a method and system of implementing a fault redundant scheme for those logic functions designated as fault tolerant. An example of the disclosed invention is depicted in FIGS. 1 and 2, although it should be understood that the present invention is not limited to this (or any other) particular embodiment, but rather is intended to cover any HDL extensions, methods, or systems of implementing a fault redundant scheme that fairly fall within the broad scope of the appended claims. In the drawings, like elements include like element numbers.

Referring now to the drawings, FIG. 1 illustrates a sample HDL code 20. Code 20 is written in VHDL at the register-transfer level (RTL) and includes instructions for adding the operator "FT" to certain logic functions. In this example, the FT operator is placed on the "out1" logic function to designate it as a fault tolerant function. In this example, the "out1" signal is composed of a logic "or" of two signals, i.e., out1=in1 or in2. Logic functions that include the FT operator are considered critical functions, i.e., fault tolerant. As one skilled in the art will appreciate, code 20 is but one example of myriad HDL code that may be used to designate particular logic functions as fault tolerant.

As explained above, generally one of the first steps in designing an IC such as a FPGA is to delineate a logic design in a standard HDL language such as VHDL or Verilog. Again, this is typically done at the RTL and is often referred to as the RTL code. After developing the RTL code, a designer runs a logic synthesis tool (not shown) to map the design delineated by the code to a target technology, i.e., FPGA or ASIC. As one skilled in the art will appreciate, the synthesis tool used must be enabled to recognize the FT operator of the present invention.

As part of a typical IC design process, the logic synthesis tool maps the RTL design to the target technology. By including the FT operator of the present invention, during the mapping process, the logic synthesis tool is alerted to the functions that have been designated as fault tolerant. As a result and as illustrated in FIG. 2, the logic synthesis tool is preprogrammed to cause the design of the IC to include a fault redundant scheme 30 for the logic functions that include the FT operator, i.e., those that have designated as fault tolerant.

Referring now to FIG. 2, a fault redundant scheme 30 is automatically implemented by the synthesis tool for each logic function that includes the FT operator, i.e., each logic function that is tagged as fault tolerant. FIG. 2 illustrates one possible scheme 30 for implementing a fault tolerant structure in hardware. As one skilled in the art will appreciate, the use of the FT operator and corresponding fault redundant scheme 30 can be implemented in any technology, e.g., including programmable logic as well as standard cell. In this example, the logic synthesizer recognized that a function in the RTL used the FT operator. As a result, fault redundant scheme 30 was included in the FPGA design. In one embodiment, fault redundant scheme 30 includes three copies of the function's logic, i.e., Copy A 32, Copy B 34, and Copy C 36, as well as a majority voter 38. Each copy (A, B, and C) implements the identical logic function and they are connected to the voter 38 where they are compared to ensure that the outputs of all three copies match. Having three copies of a logic function provides fault tolerance, so voter 38 can detect and correct any single logic error that occurs within any of these copies. Of course, in other embodiments, more complex fault redundancy schemes may be devised, e.g., more than three copies or a plurality of voters.

In use, inputs 40 are first introduced to copies 32, 34, and 36 of fault redundant scheme 30. Next, the output from each copy 32, 34, and 36, i.e., OutA, OutB, and OutC, respectively, are transmitted to voter 38. Voter 38 determines if a mismatch exists between OutA, OutB, and OutC. Voter 38 works on a majority basis with the majority input from OutA, OutB, and OutC determining the correct output, i.e., output 42, to be transmitted to downstream logic. Additionally, voter 38 produces one error signal, i.e., A bad, B bad, C bad, for each copy that it checks, i.e., copy 32, 34, and 36. This provides fault isolation, so when an error signal is asserted, i.e., A bad, B bad, C bad, the redundant copy that is failing, i.e., Copy A, Copy B or Copy C, is taken offline.

Embodiments of the present invention include both a method and a system for including a new HDL extension at the RTL so users may specify which functions to protect from faults, i.e., the FT operator discussed above. Of course, every function in a design may be protected. However, by only providing fault tolerance for particular design functions, the overall IC area required may be minimized. The FT operator allows users to balance the area overhead of implementing fault tolerance versus the extra protection that it provides on a function by function basis.

While the present invention has been described in connection with specified embodiments, it will be understood that it is not so limited. On the contrary, it is intended to cover all alternatives, modifications and equivalents as may be included within the spirit and scope of the invention as defined in the appended claims.

The invention claimed is:

1. A method of building fault tolerant logic functions in an integrated circuit, comprising the steps of:
   creating an integrated circuit design description using a hardware design language at a register-transfer level;
   adding a fault tolerant operator to particular logic functions in said integrated circuit design description;
   building at least three redundant physical copies for each logic function of the particular logic functions having a fault tolerant operator;
   determining which of said at least three redundant physical copies is faulty using a majority voter; and
   receiving at said majority voter an output value from each of said at least three redundant physical copies of each logic function, wherein for any output value at said majority voter, said respective copy is deemed faulty.

2. A method according to claim 1, wherein said integrated circuit design description in said creating step is for a FPGA.

3. A method according to claim 1, further comprising the step of disabling any of said at least three redundant physical copies that are faulty.

4. A method of creating fault tolerant logic functions during design of an integrated circuit using a HDL at the RTL and a logic synthesis tool, comprising the steps of:
   creating an integrated circuit design description using the hardware design language at the RTL;
   adding a fault tolerant operator to each logic function in said integrated circuit design description;
   processing said integrated circuit design description through the logic synthesis tool after said adding step;
   including a fault redundant scheme in said integrated circuit design description for each logic function having a fault tolerant operation;
   building at least three physical copies of each logic function having a fault tolerant operator with said fault redundant scheme;
   determining which of said at least three physical copies is faulty using a majority voter; and receiving at said majority voter an output value from each of said at least three physical copies of each logic function, wherein for any output value at said majority voter, said respective copy is deemed faulty.

5. A method according to claim 4, further comprising the step of disabling any of said at least three physical copies that are faulty.

6. A method according to claim 4, wherein said integrated circuit design description in said creating step is for a FPGA.

7. A system for creating fault tolerant logic functions during design of an integrated circuit using a HDL at the RTL and a logic synthesis tool, the system comprising:
   means for creating an integrated circuit design description using the hardware design language at the RTL;
   means for adding a fault tolerant operator to each logic function in said integrated circuit design description;
   means for synthesizing said integrated circuit design description after said means for adding step;
   means for building fault redundancy into said integrated circuit design description for each logic function having a fault tolerant operator;

means for building fault redundancy includes building at least three physical copies of each logic function having a fault tolerant operator;
means for determining which of said at least three physical copies is faulty using majority voter; and
means for receiving at said majority voter an output value from each of said at least three physical copies of each logic function, wherein for any output value at said majority voter, said respective copy is deemed faulty.

8. A system according to claim 7, wherein said integrated circuit design description in said creating step is for a FPGA.

9. A system according to claim 7, further comprising:
means for disabling any of said at least three redundant physical copies that are faulty.

* * * * *